US009852892B1

(12) United States Patent
Itoh et al.

(10) Patent No.: US 9,852,892 B1
(45) Date of Patent: Dec. 26, 2017

(54) MICROWAVE SUPPLY APPARATUS, PLASMA PROCESSING APPARATUS, AND PLASMA PROCESSING METHOD

(71) Applicants: TOKYO ELECTRON LIMITED, Tokyo (JP); National University Corporation Nagoya University, Aichi (JP)

(72) Inventors: Hitoshi Itoh, Tokyo (JP); Masaru Hori, Nagoya (JP); Hirotaka Toyoda, Nagoya (JP); Haruka Suzuki, Nagoya (JP); Makoto Sekine, Nagoya (JP)

(73) Assignees: TOKYO ELECTRON LIMITED, Tokyo (JP); National University Corporation Nagoya University, Aichi (JP)

( * ) Notice: Subject to any disclaimer, the term of this patent is extended or adjusted under 35 U.S.C. 154(b) by 0 days.

(21) Appl. No.: 15/626,905

(22) Filed: Jun. 19, 2017

(30) Foreign Application Priority Data

Jun. 20, 2016 (JP) .................. 2016-121668

(51) Int. Cl.
*H01J 37/32* (2006.01)
*H05H 1/46* (2006.01)
(52) U.S. Cl.
CPC ... *H01J 37/32311* (2013.01); *H01J 37/32449* (2013.01); *H01J 2237/2482* (2013.01)
(58) Field of Classification Search
CPC .............. H01J 37/32; H01J 37/32311; H01J 37/32229; H01J 37/32211; H01J 37/32192; H05H 1/46; H05H 2001/4607; H05H 2001/4622
See application file for complete search history.

(56) References Cited

U.S. PATENT DOCUMENTS

| 5,843,236 | A | * | 12/1998 | Yoshiki | ............. | H01J 37/32192 |
| | | | | | | 118/723 ME |
| 6,198,453 | B1 | * | 3/2001 | Chew | .................... | H01Q 13/10 |
| | | | | | | 343/767 |
| 6,204,606 | B1 | * | 3/2001 | Spence | ............. | H01J 37/32192 |
| | | | | | | 118/723 ME |
| 6,744,802 | B1 | * | 6/2004 | Ohmi | .................. | G03F 7/70025 |
| | | | | | | 372/55 |
| 2014/0251955 | A1 | * | 9/2014 | Itoh | .................... | H01J 37/32229 |
| | | | | | | 216/69 |

FOREIGN PATENT DOCUMENTS

JP         2014-175051 A         9/2014

* cited by examiner

*Primary Examiner* — Thai Pham
(74) *Attorney, Agent, or Firm* — Studebaker & Brackett PC

(57) ABSTRACT

A microwave supply apparatus includes a waveguide, a circulator, and a matcher, a first port of the circulator receives a microwave from an input end. First and second ends of the waveguide are coupled to second and third ports of the circulator, respectively. The matcher is provided between the input end and the first port of the circulator. The waveguide includes a rectangular waveguide having first and second walls facing each other, and third and fourth walls facing each other. A slot hole is formed in the first wall, and the slot hole is provided at a region deviated to the third wall side. The waveguide includes a first ridge portion provided therein. The first ridge portion faces the slot hole, is in contact with the second wall and third wall, and is separated from the first wall and fourth wall.

11 Claims, 9 Drawing Sheets

MICROWAVE SUPPLY APPARATUS, PLASMA PROCESSING APPARATUS, AND PLASMA PROCESSING METHOD

CROSS-REFERENCE TO RELATED APPLICATIONS

This application is based on and claims the benefit of priority from Japanese Patent Application No. 2016-121668 filed on Jun. 20, 2016, the entire contents of which are incorporated herein by reference.

FIELD

Exemplary embodiments of the present disclosure relate to a microwave supply apparatus, a plasma processing apparatus, and a plasma processing method.

BACKGROUND

In processing a workpiece, an apparatus for generating plasma of a processing gas by a microwave is used. An example of such a apparatus is disclosed in Japanese Patent Application Laid-Open Publication No. 2014-175051. The apparatus disclosed in Japanese Patent Application Laid-Open Publication No. 2014-175051 includes a waveguide, a circulator, and a matcher.

The waveguide includes a first end and a second end. The circulator includes a first port, a second port, and a third port. The second port is coupled to the first end of the waveguide, and the third port is coupled to the second end of the waveguide. The matcher is provided between an input end of the microwave and the first port of the circulator. In addition, a slot hole extending in a propagation direction of the microwave is formed in the waveguide. In this apparatus, the microwave from the input end is propagated from the first port to the second port, and then, the microwave propagated to the second port is propagated from the first end of the waveguide to the second end of the waveguide. The microwave propagated to the second end of the waveguide is returned to the matcher from the third port of the circulator via the first port. A part of the microwave returned to the matcher is reflected by the matcher to be propagated to the first port of the circulator. In this apparatus, a standing wave is suppressed from being generated in the waveguide. That is, in order to generate plasma, a travelling wave is generated in the waveguide. In addition, since the microwave supplied from the input end and the microwave reflected from the matcher are supplied to the waveguide, a power density of the microwave becomes high in the slot hole. In this apparatus, the processing gas supplied to the slot hole is excited by the microwave, and the plasma is generated.

In the apparatus disclosed in Japanese Patent Application Laid-Open Publication No. 2014-175051, in order to more stably generate the plasma in the slot hole, it is desired to further increase the power density of the microwave in the slot hole.

SUMMARY

In one aspect, a microwave supply apparatus that propagates a microwave for generation of plasma is provided. The microwave supply apparatus includes a waveguide, a circulator, and a matcher. The waveguide includes a first end and a second end, and extends between the first end and the second end. The circulator includes a first port, a second port, and a third port. The second port is coupled to the first end of the waveguide, and the third port coupled to the second end of the waveguide. The circulator is configured to propagate the microwave coming from an input end of the microwave supply apparatus, from the first port to the second port, and to return the microwave received at the third port, from the first port to a side of the input end. The matcher is provided between the input end and the first port of the circulator. The matcher is configured to reflect a part of the microwave returned from the first port to the side of the input end, to the first port of the circulator. The waveguide includes a rectangular waveguide. The rectangular waveguide includes first to fourth walls. The first and second walls face each other. The third and fourth walls intersect with the first and second walls and face each other. A slot hole extends along the propagation direction of the microwave in the waveguide is formed on the first wall. The slot hole is provided in a region deviated to a side of the third wall. The waveguide includes a first ridge portion provided therein. The first ridge portion has a rectangular parallelepiped shape. The first ridge portion is separated from the first wall, faces the slot hole, is in contact with the second wall and the third wall, and is separated from the fourth wall.

The foregoing summary is illustrative only and is not intended to be in any way limiting. In addition to the illustrative aspects, exemplary embodiments, and features described above, further aspects, exemplary embodiments, and features will become apparent by reference to the drawings and the following detailed description.

DETAILED DESCRIPTION

Figure 1:
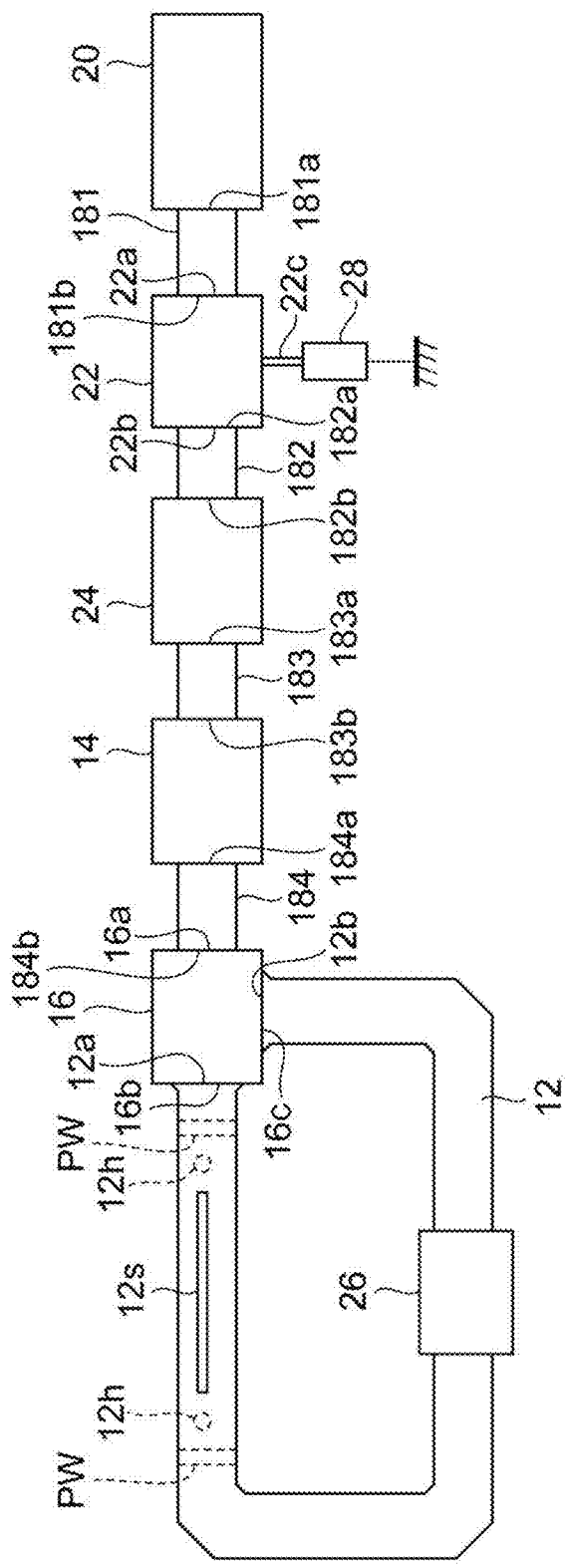
FIG. 1 is a plan view illustrating a microwave supply apparatus according to an exemplary embodiment.

In the following detailed description, reference is made to the accompanying drawings, which form a part hereof. The exemplary embodiments described in the detailed description, drawing, and claims are not meant to be limiting. Other exemplary embodiments may be utilized, and other changes may be made, without departing from the spirit or scope of the subject matter presented here.

In one aspect, a microwave supply apparatus that propagates a microwave for generation of plasma is provided. The microwave supply apparatus includes a waveguide, a circulator, and a matcher. The waveguide includes a first end and a second end, and extends between the first end and the second end. The circulator includes a first port, a second port, and a third port. The second port is coupled to the first end of the waveguide, and the third port coupled to the second end of the waveguide. The circulator is configured to propagate the microwave coming from an input end of the microwave supply apparatus, from the first port to the second port, and to return the microwave received at the third port, from the first port to a side of the input end. The matcher is provided between the input end and the first port of the circulator. The matcher is configured to reflect a part of the microwave returned from the first port to the side of the input end, to the first port of the circulator. The waveguide includes a rectangular waveguide. The rectangular waveguide includes first to fourth walls. The first and second walls face each other. The third and fourth walls intersect with the first and second walls and face each other. A slot hole extends along the propagation direction of the microwave in the waveguide is formed on the first wall. The slot hole is provided in a region deviated to a side of the third wall. The waveguide includes a first ridge portion provided therein. The first ridge portion has a rectangular parallelepiped shape. The first ridge portion is separated from the first wall, faces the slot hole, is in contact with the second wall and the third wall, and is separated from the fourth wall.

A current density in the first wall at a position close to an edge portion of the first wall is higher than that at the center of the first wall. In the microwave supply apparatus in the aspect, since the slot hole is formed in the region deviated to the third wall side, the current density in the region where the slot hole is formed is high. Therefore, it is possible to increase the power density of the microwave in the slot hole. In addition, the first ridge portion is provided so as to face the slot hole. The first ridge portion is separated from the first wall and faces the slot hole, is in contact with the second wall and the third wall, and is separated from the fourth wall. According to the first ridge portion, a length of a space continuing to the slot hole in a direction in which the first wall and the second wall are facing each other becomes small. Therefore, it is possible to further increase the power density of the microwave in the slot hole.

In an exemplary embodiment, a width of the first ridge portion in a first direction in which the third wall and the fourth wall are facing each other is larger than 18 mm and smaller than 52 mm. In an exemplary embodiment, a height of the first ridge portion in a direction in which the first wall and the second wall are facing each other is larger than 7.5 mm and smaller than a height of the waveguide in the second direction.

In an exemplary embodiment, the microwave supply apparatus further includes second ridge portions provided continuously to both ends of the first ridge portion in the propagation direction. Each of the second ridge portions has a rectangular parallelepiped shape. Each of the second ridge portions is separated from the first wall and is in contact with the second wall and the third wall, and is separated from the fourth wall. A length of a gap between the first wall and each of the second ridge portions is larger than a gap between the first wall and the first ridge portion. The second ridge portions suppress the reflection of the microwave in both ends of the first ridge portion.

In an exemplary embodiment, a height of each of the second ridge portions in a direction in which the first wall and the second wall are facing each other is configured to be not less than 14 mm and not more than 18 mm.

In an exemplary embodiment, the microwave supply apparatus further includes a gas supply hole configured to introduce a processing gas for generation of the plasma into the waveguide. In an exemplary embodiment, the microwave supply apparatus further includes a microwave generator configured to generate a microwave and to supply the microwave to the input end.

In another aspect, a plasma processing apparatus is provided. The plasma processing apparatus includes the microwave supply apparatus described above, a gas supply unit configured to supply a processing gas to the slot hole, and a chamber body configured to provide a chamber for processing a workpiece by plasma of the processing gas.

In still another aspect, a plasma processing method in which the plasma processing apparatus described above is used is provided. The plasma processing method includes accommodating a workpiece in the chamber, and processing the workpiece by plasma of the processing gas supplied from the gas supply unit. In an exemplary embodiment, the processing gas contains a molecular gas and a ratio of a flow rate of the molecular gas to a total flow rate of the processing gas is equal to not less than 0.2 and not more than 1. In an exemplary embedment, the molecular gas is nitrogen gas.

Hereinafter, various exemplary embodiments will be described in detail with reference to the drawings. In the drawings, the same reference signs will be given to the same or corresponding parts.

First, a microwave supply apparatus 10 in an exemplary embodiment will be described. FIG. 1 is a plan view illustrating a microwave supply apparatus according to an exemplary embodiment. The microwave supply apparatus 10 illustrated in FIG. 1 is a microwave supply apparatus for generation of plasma, and includes a waveguide 12, the matcher 14, and a circulator 16. In one embodiment, the microwave supply apparatus 10 may further include a plurality of waveguides 181 to 184, a microwave generator 20, an isolator 22, a directional coupler 24, and a directional coupler 26.

The plurality of waveguides 181 to 184 are waveguides having a hollow structure, and for example, a rectangular waveguide. The plurality of waveguides 181 to 184 may be made of a metal such as copper, aluminum, iron, stainless steel or the like, or an alloy thereof. Pressure in each of the plurality of waveguides 181 to 184 may be set to be atmospheric pressure. One end of the waveguide 181 among the plurality of waveguides 181 to 184 is an input end 181a.

The microwave generator 20 is coupled to one end of the waveguide 181, that is, the input end 181a. The microwave generator 20 generates a microwave and supplies the microwave to the waveguide 181. A frequency of the microwave is, for example, about 2.45 GHz. The microwave supplied to the input end 181a of the waveguide 181 is propagated to the other end 181b of the waveguide 181. In one exemplary embodiment, the microwave generator 20 can generate the microwave which is a continuous wave. The microwave generator 20 has a pulse oscillation function and may generate a pulsed microwave. The microwave generator 20 is connected to a controller Cont, which will be described later, and adjusts the power of the microwave according to a control signal from the controller Cont. In addition, in a case of generating the pulsed microwave, the microwave generator 20 adjusts a frequency and a duty ratio of the pulse according to the control signal from the controller Cont. The pulsed microwave generated by the microwave generator 20 may be any one of a square wave or a sine wave.

The isolator 22 is provided between the other end 181b of the waveguide 181 and one end 182a of the waveguide 182. The isolator 22 includes a first port 22a, a second port 22b, and a third port 22c. The first port 22a is a port that receives the microwave from the microwave generator 20 via the waveguide 181. The isolator 22 outputs the microwave received at the first port 22a, from the second port 22b. In addition, the isolator 22 outputs the microwave received from the waveguide 182 at the second port 22b, from the third port 22c. A dummy load 28 is connected to the third port 22c. The microwave supplied to the dummy load 28 is consumed in the dummy load. For example, the dummy load 28 converts the microwave into heat. The isolator 22 suppresses a reflection wave that is returning to the microwave generator 20.

The directional coupler 24 is provided between the other end 182b of the waveguide 182 and one end 183a of the waveguide 183. The directional coupler 24 passes the microwave propagated from the second port 22b of the isolator 22 via the waveguide 182, and blocks the microwave propagated from the matcher 14 side via the waveguide 183. The reflection wave is cancelled by the directional coupler 24, and the generation of the standing wave in the waveguides 181 to 184 can be suppressed.

The matcher 14 is provided between the other end 183b of the waveguide 183 and one end 184a of the waveguide 184. The matcher 14 may be, for example, an EH tuner. The EH tuner includes an E tuner portion and an H tuner portion. The EH tuner adjusts respective protrusion amounts of plungers of the E tuner portion and the H tuner portion in a waveguide path between the waveguide 183 and the waveguide 184. In this way, the EH tuner adjusts impedance. When the microwave supply apparatus 10 is operating, the protrusion amounts of the plungers of the EH tuner are adjusted. The matcher 14 reflects a part of the microwave returned from the other end 184b of the waveguide 184 toward the circulator 16. The matcher 14 may include another tuner such as a 4E tuner or a stub tuner instead of the EH tuner.

The circulator 16 includes a first port 16a, a second port 16b, and a third port 16c. The first port 16a is coupled to the other end 184b of the waveguide 184. The second port 16b is coupled to a first end 12a of the waveguide 12. The third port 16c of the circulator 16 is coupled to the second end 12b of the waveguide 12. The circulator 16 propagates the microwave coming from the input end 181a, from the first port 16a to the second port 16b. In addition, the circulator 16 is configured to return the microwave received at the third port 16c, from the first port 16a to the input end 181a side.

The waveguide 12 is a waveguide having a hollow structure, and for example, is a rectangular waveguide. A width GW (a width between inner surfaces facing each other in the Y direction. See FIG. 2) of the waveguide 12 is, for example, 96 mm. A height (a width between inner surfaces facing each other in the Z direction. See FIG. 2) of the waveguide 12 is, for example, 27 mm. The waveguide 12 includes the first end 12a and the second end 12b described above. The waveguide 12 may be made of a metal such as copper, aluminum, iron, stainless steel or the like, or an alloy thereof. Pressure in the waveguide 12 may be set to be atmospheric pressure. A waveguide structure including the waveguide 12, the circulator 16, and the matcher 14 provides a looped waveguide path.

A directional coupler 26 is provided between the first end 12a and the second end 12b in the waveguide 12. The directional coupler 26 passes the microwave propagated from the first end 12a toward the second end 12b, and blocks the microwave propagated from the second end 12b toward the first end 12a.

In an exemplary embodiment, a gas supply hole 12h is formed in the waveguide 12. The gas supply hole 12h is a hole for receiving a processing gas from a gas supply unit, which will be described below, and introducing the processing gas into the waveguide 12. The processing gas supplied to the gas supply hole 12h is supplied to a slot hole 12s through the waveguide 12. In an exemplary embodiment, two gas supply holes 12h are formed in the waveguide 12. Distances from the two gas supply holes 12h and the slot hole 12s are substantially the same to each other. In this case, it is possible to cause the processing gas to flow uniformly from the two gas supply holes 12h to the slot hole 12s. The number of gas supply holes 12h may be arbitrary number equal to or more than one.

Figure 2:
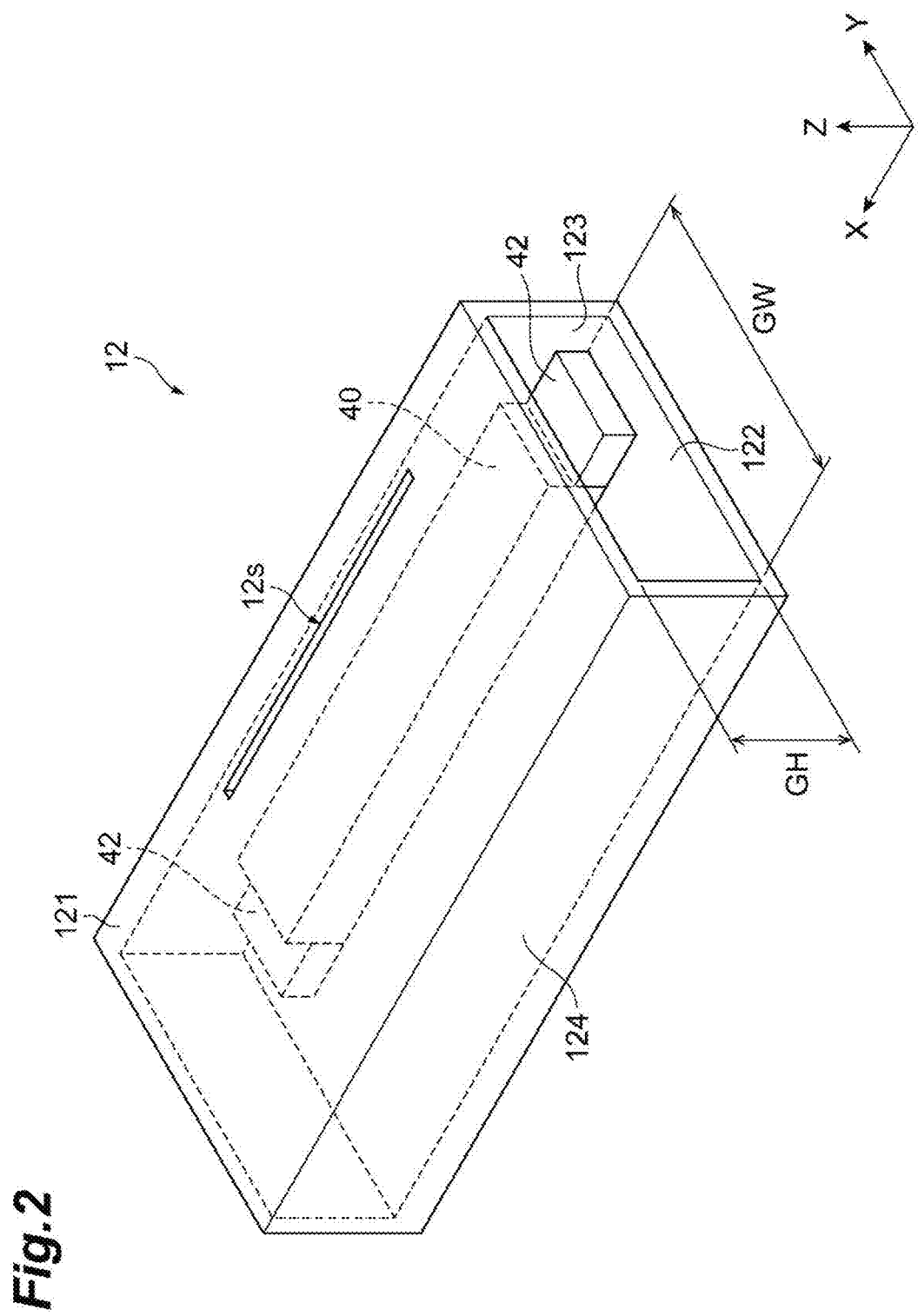
FIG. 2 is a perspective view of a portion of a waveguide in which a slot hole is formed.
Figure 3:
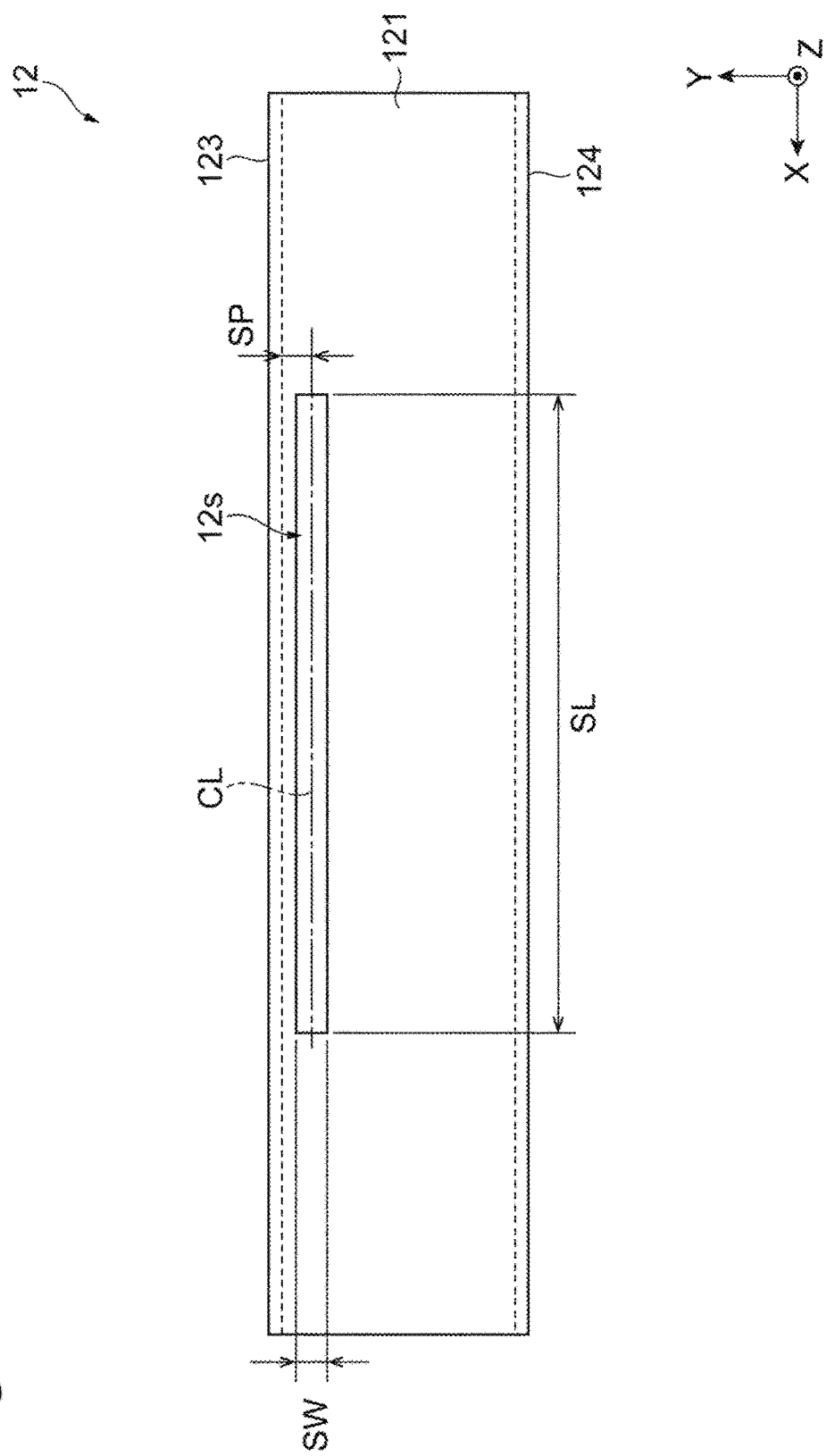
FIG. 3 is a plan view of the portion of the waveguide in which the slot hole is formed.

The waveguide 12 includes a portion extending in one direction, and the slot hole 12s is formed in the portion. FIG. 2 is a perspective view of the portion of the waveguide 12 in which the slot hole 12s is formed. FIG. 3 is a plan view of the portion of the waveguide 12 in which the slot hole 12s is formed. As illustrated in FIG. 2, at the portion in which the slot hole 12s is formed, the waveguide 12 includes a first wall 121, a second wall 122, a third wall 123, and a fourth wall 124. The first wall 121 and the second wall 122 are facing each other. The third wall 123 and the fourth wall 124 are intersecting with or substantially orthogonal to the first wall 121 and second wall 122, and are facing each other.

The slot hole 12s is formed in the first wall 121 and penetrates the first wall 121. The slot hole 12s has a long hole shape extending along the propagation direction (X direction) of the microwave. A length SL of the slot hole 12s in the X direction is, for example, 300 mm. In addition, a width (width in the Y direction) of the slot hole 12s is, for example, 0.1 to 0.5 mm.

The slot hole 12s is formed in a region deviated to the third wall 123 side. That is, the slot hole 12s is formed at a position deviated to the third wall 123 side from the center of the first wall 121. A distance SP between an inner surface of the third wall 123 and a center line CL of the slot hole 12s is, for example, 8 mm.

When the microwave is propagated in the waveguide 12, a current density at a position close to an edge portion in the first wall 121 is higher than that at the center of the first wall 121. Since the slot hole 12s is formed in the region deviated to the third wall 123 side, the current density in the region where the slot hole 12s is formed is high. Therefore, the power density of the microwave in the slot hole 12s is high.

A first ridge portion 40 is provided in the waveguide 12 at the portion where the slot hole 12s is formed. In an exemplary embodiment, two second ridge portions 42 are further provided in the waveguide 12. The first ridge portion 40 is made of a metal material similar to the metal material that forms the waveguide 12. For example, the first ridge portion 40 is made of aluminum. The first ridge portion 40 may be made of a metal such as copper, iron, stainless steel, or an alloy thereof. The second ridge portion 42 is also made of a metal material. The second ridge portion 42 is desirably made of a metal material same as that forming the first ridge portion 40.

Figure 4:
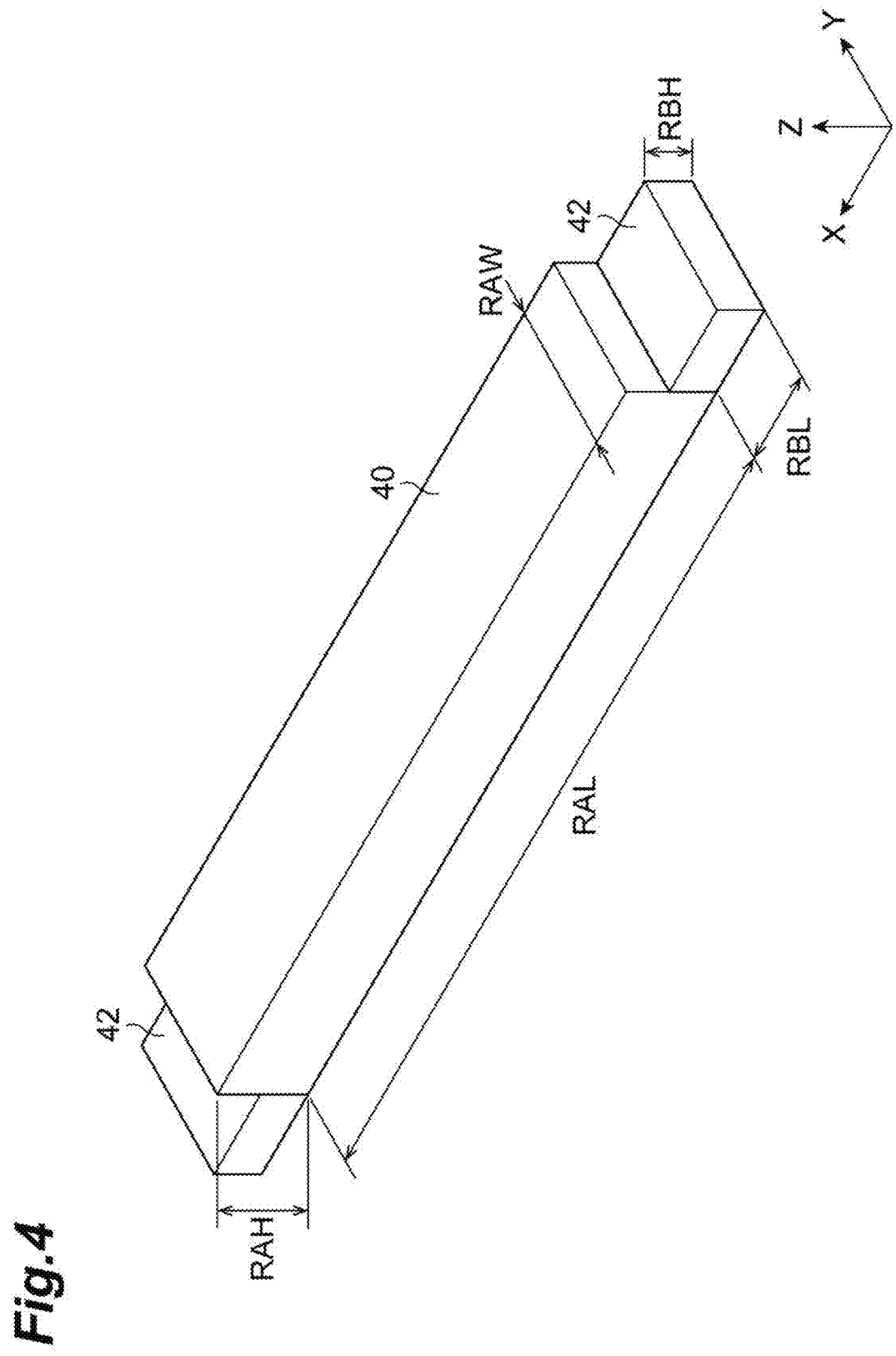
FIG. 4 is a perspective view of a first ridge portion and second ridge portions.

FIG. 4 is a perspective view of the first ridge portion and the second ridge portion. Hereinafter, the description will be made with reference to FIG. 2 and FIG. 4. The first ridge portion 40 has a rectangular parallelepiped shape elongated in the X direction. A length RAL of the first ridge portion 40 in the X direction is, for example, 400 mm. The first ridge portion 40 is separated from the inner surface of the first wall 121, and faces the slot hole 12s. The first ridge portion 40 is in contact with the second wall 122 and the third wall 123. In addition, the first ridge portion 40 is separated from the inner surface of the fourth wall 124. That is, the first ridge portion 40 is provided along the corner portion where the second wall 122 and the third wall 123 are intersecting with each other.

According to the first ridge portion 40, a length of a space in the waveguide 12 continuing to the slot hole 12s in the direction (Z direction) in which the first wall 121 and the second wall 122 are facing each other decreases. Therefore, the power density of the microwave in the slot hole 12s can be further increased.

In an exemplary embodiment, a width RAW of the first ridge portion 40 in the direction (Y direction) in which the third wall 123 and the fourth wall 124 are facing each other is larger than 18 mm and smaller than 52 mm. According to the first ridge portion 40 having the width RAW, it is possible to obtain the power density of the microwave that is higher than that in the slot hole 12s in a case where the width RAW is the same as the width GW of the waveguide 12.

In an exemplary embodiment, a height RAH of the first ridge portion 40 in the direction (Z direction) in which the first wall 121 and the second wall 122 are facing each other is larger than 7.5 mm and smaller than the height GH of the waveguide 12. For example, the height RAH of the first ridge portion 40 is smaller than 27 mm. According to the first ridge portion 40 having the height RAH, the power density of the microwave in the slot hole 12s can be further increased.

Each of the two second ridge portions 42 has a rectangular parallelepiped shape. The two second ridge portions 42 is provided continuing to both ends of the first ridge portion 40 in the X direction, respectively. Widths of the two second ridge portions 42 are substantially the same as the width RAW of the first ridge portion 40. A length of a gap between each of the two second ridge portions 42 and the first wall 121 is larger than a length of a gap between the first ridge portion 40 and the first wall 121. The height of the second ridge portion 42 in the Z direction is selected from a range of, for example, not less than 14 mm and not more than 18 mm. According to the second ridge portions 42, the reflection of the microwave at both ends of the first ridge portion 40 is suppressed.

The description will be made with reference to FIG. 1 again. In an exemplary embodiment, the microwave supply apparatus 10 can include a partition wall PW in the waveguide 12. The partition wall PW is made of a dielectric such as quartz, ceramic, polytetrafluoroethylene or the like. The partition wall PW prevents the processing gas supplied into the waveguide 12 from entering the microwave generator 20. On the other hand, the partition wall PW allows the microwave from the microwave generator 20 to pass therethrough. In the example illustrated in FIG. 1, the number of partition walls PW is two. One partition wall PW is provided at one side of the slot hole 12s and the other partition wall PW is provided at the other side of the slot hole 12s. In addition, one of the two gas supply holes 12h described above is provided between the slot hole 12s and one partition wall PW, and the other gas supply hole 12h is provided between the slot hole 12s and the other partition wall PW.

In the microwave supply apparatus 10, the microwave generated by the microwave generator 20 is input to the first port 22a of the circulator 16 via the plurality of waveguide 181 to 184. The microwave input to the first port 22a is input to the first end 12a of the waveguide 12 coupled to the second port 22b of the circulator 16. The microwave input to the first end 12a is propagated from the first end 12a toward the second end 12b in the waveguide 12. The microwave arrived at the second end 12b is returned to the matcher 14 via the third port 16c coupled to the second end 12b and first port 16a of the circulator 16. The matcher 14 reflects a part of the returned microwave and returns the part of the microwave to the first port 16a of the circulator 16. In the microwave supply apparatus 10, the generation of the reflection wave is suppressed in the waveguide 12, and the travelling wave is propagated in the waveguide 12. The travelling wave causes the processing gas to be excited in the slot hole 12s. Accordingly, the plasma is generated in the slot hole 12s. As described above, in the microwave supply apparatus 10, since the microwave having the high power density can be obtained in the slot hole 12s, it is possible to stably generate the plasma across the slot hole 12s. For example, when using a processing gas containing a stable gas such as a molecular gas at a high density, it is possible to stably generate the plasma across the slot hole 12s.

Figure 5:
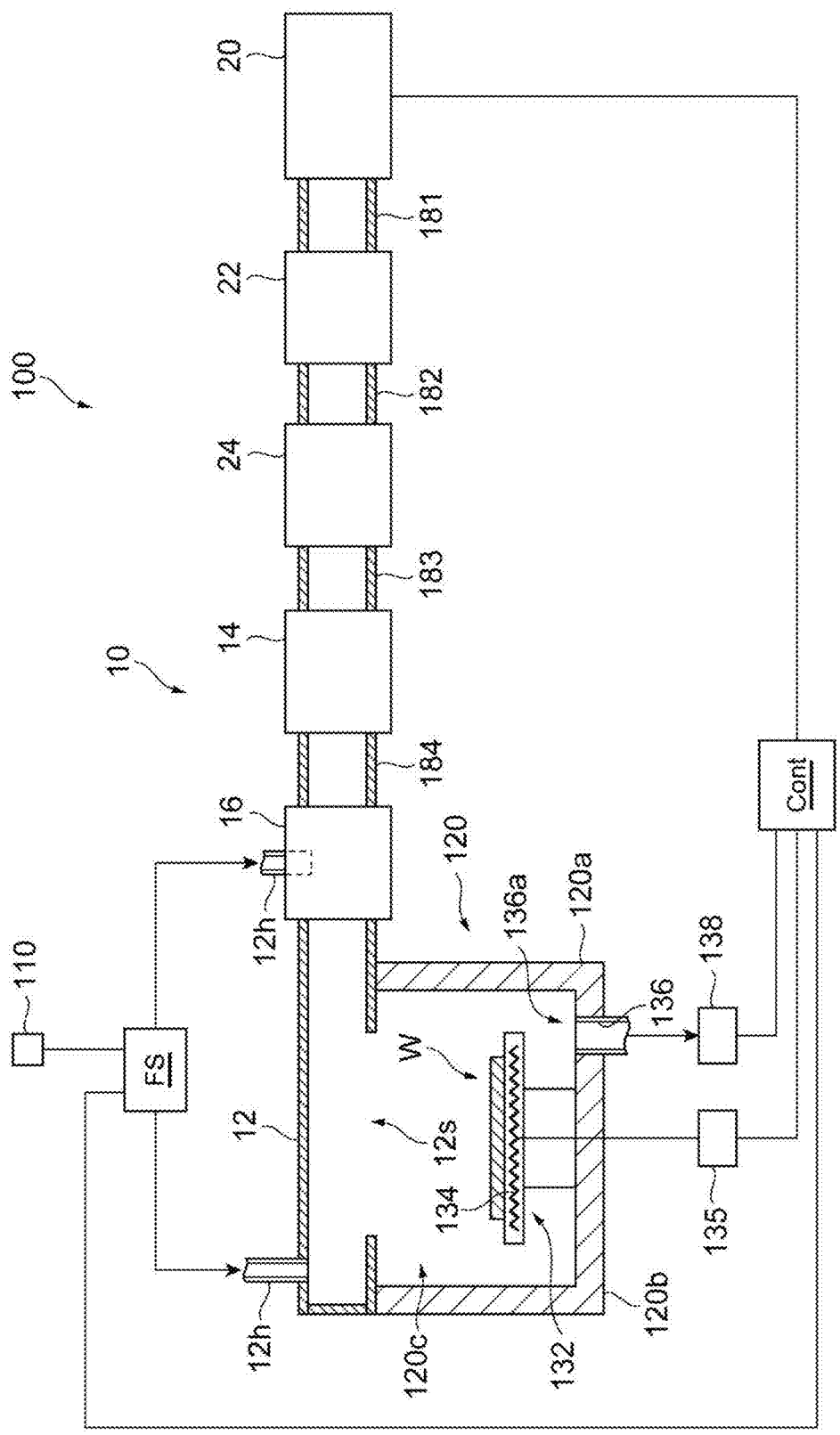
FIG. 5 is a diagram schematically illustrating a plasma processing apparatus according to an exemplary embodiment.

Hereinafter, a plasma processing apparatus according to an exemplary embodiment will be described. FIG. 5 is a diagram schematically illustrating a plasma processing apparatus according to an exemplary embodiment. In FIG. 5, a partially broken view of the plasma processing apparatus is illustrated. The plasma processing apparatus 100 illustrated in FIG. 5 includes the microwave supply apparatus 10 described above. In the plasma processing apparatus 100, a plasma processing can be applied to a workpiece W under the atmospheric pressure environment. In the plasma processing apparatus 100, the plasma processing may be applied to the workpiece W under the reduced pressure environment.

The plasma processing apparatus 100 further includes a gas supply unit 110 and a chamber body 120. The gas supply unit 110 may include one or more gas sources, one or more valves, and one or more flow controllers. The gas supply unit 110 supplies a processing gas to the waveguide 12 from the one or more gas sources via a flow splitter FS and the gas supply hole 12h. The flow splitter FS distributes the processing gas supplied from the gas supply unit 110 to the two gas supply holes 12h at a distribution ratio set by a below-described controller Cont or the like.

The chamber body 120 provides an internal space thereof as a chamber 120c. The chamber body 120 may include a side wall 120a and a bottom wall 120b. The side wall 120a has a substantially cylindrical shape and extends in the vertical direction. The bottom wall 120b is provided at the lower end side of the side wall 120a. An exhaust pipe 136 having an exhaust hole 136a is attached to the bottom wall 120b. The exhaust pipe 136 is connected to an exhaust apparatus 138. The exhaust apparatus 138 is controlled by the controller Cont, which will be described below, and adjusts the pressure in the chamber 120c by adjusting a flow rate of the gas exhausted from the chamber 120c. The exhaust apparatus 138 has a vacuum pump such as a dry pump. The pressure in the chamber 120c is adjusted so as to be the desired pressure such as the state of the normal pressure or the reduced pressure by the exhaust apparatus 138. The exhaust apparatus 138 may be connected to the waveguide 12 via the exhaust pipe and the valve, and the pressure in the waveguide 12 may be adjusted.

A stage 132 is provided in the chamber 120c. The workpiece W is placed on the stage 132. In an exemplary embodiment, a heater 134 which is a heating element may be provided in the stage 132. The heater 134 is connected to a heater power supply 135, and is configured to generate heat by an electric power supplied from the heater power supply 135, and heat the stage 132. The heater power supply 135 is controlled by the controller Cont described below, and the amount of heat generated by the heater 134 is adjusted by adjusting the electric power supplied to the heater 134.

An upper end of the chamber body 120 is open. The waveguide 12 is disposed at the upper end of the chamber main body 120 such that the slot hole 12s faces the workpiece W.

In an exemplary embodiment, the plasma processing apparatus 100 can include the controller Cont configured to perform control of each part of the plasma processing apparatus 100. The controller Cont performs the control of supplying and stopping of supplying the microwave from the microwave generator 20, the control of a microwave power, a frequency of the pulses, the duty ratio, or the like, the control of the flow rate of the processing gas, the control of the distribution ratio by the flow splitter FS, the control of the exhaust apparatus 138, the control of the heater power supply 135, and the like. The controller Cont may be, for example, a programmable computer apparatus.

Next, a plasma processing method using the above-described plasma processing apparatus 100 will be described. In the plasma processing method, the workpiece W is accommodated in the chamber 120c in a first step. The workpiece W is placed on the stage 132.

In a subsequent second step, the plasma of the processing gas supplied from the gas supply unit 110 is generated by the microwave supply apparatus 10. The workpiece W is processed by ions and/or radicals from the plasma.

In an exemplary embodiment, the processing gas may contain a molecular gas. A ratio of the flow rate of the molecular gas to the total flow rate of the processing gas may be not less than 0.2 and not more than 1. The molecular gas may be nitrogen gas or oxygen gas. However, another molecular gas may be used. In addition to the molecular gas, the processing gas may further contain a rare gas such as argon gas or helium gas.

As described above, according to the microwave supply apparatus 10, the power density of the microwave in the slot hole 12s is improved. Therefore, it is possible to stably generate the plasma in the slot hole 12s even if the processing gas containing the molecular gas is used. According to the plasma processing method, for example, in a case where the nitrogen gas is used as the molecular gas, it is possible to perform nitridization on the workpiece W.

Hereinafter, an electromagnetic field simulation performed for the evaluation of the microwave supply apparatus 10 will be described.

In a first simulation, magnetic field intensity in the slot hole 12s was obtained while changing the width RAW of the first ridge portion 40 to various values as a parameter. Conditions for the first simulation are listed as below.

Conditions for the First Simulation
    Width GW of the waveguide 12: 96 mm
    Height GH of the waveguide 12: 27 mm
    Height RAH of the first ridge portion 40: 13.5 mm
    Length RAL of the first ridge portion 40: 400 mm
    Position where the slot hole 12s is formed (distance SP): 8 mm
    Length SL of the slot hole 12s: 300 mm
    Width SW of the slot hole 12s: 0.1 mm
    Frequency of the microwave: 2.45 GHz
    Power of the microwave: 2.5 kW
    Mode of the microwave: continuous wave.

Figure 6:
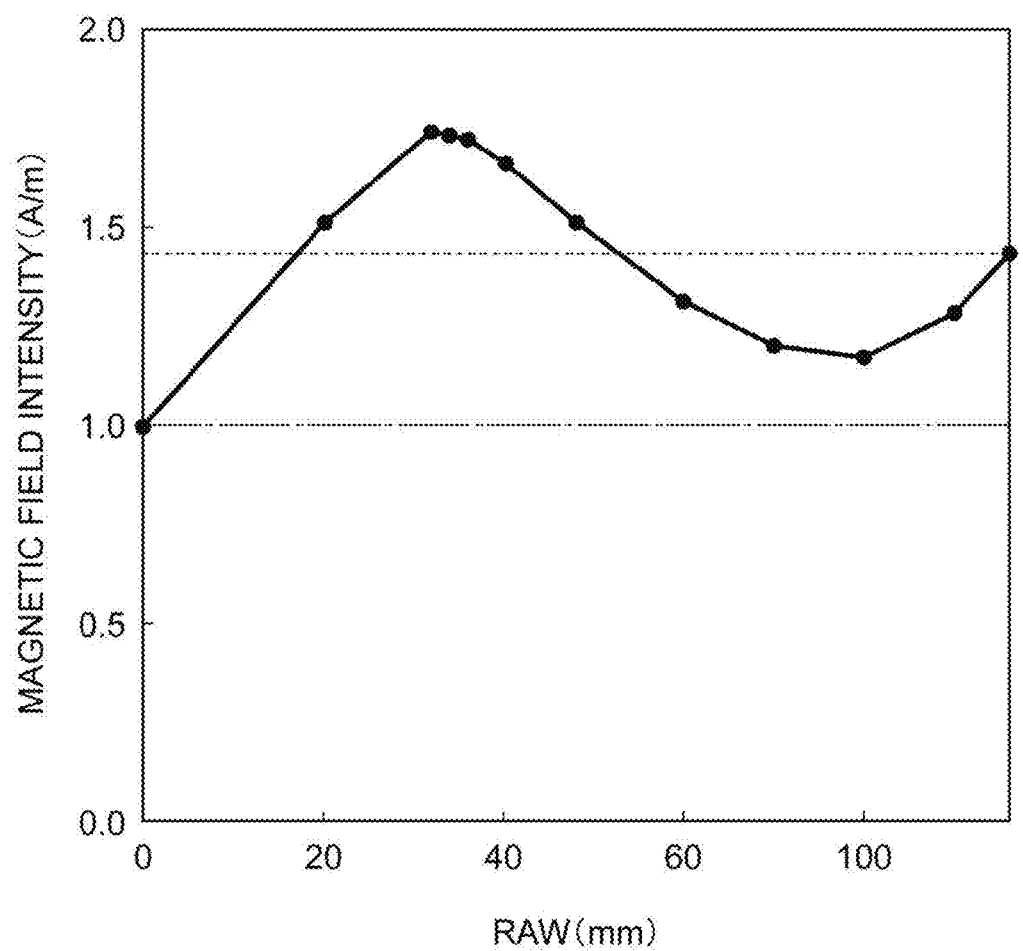
FIG. 6 is a graph illustrating a result of a first simulation.

FIG. 6 is a graph illustrating a result of the first simulation. The horizontal axis in FIG. 6 represents the width RAW of the first ridge portion 40 and the vertical axis represents an average value of the magnetic field intensity in the slot hole 12s. In addition, a dash-dotted line illustrated in FIG. 6 represents the average value of the magnetic field intensity in the slot hole 12s in a case where the first ridge portion 40 and second ridge portions 42 are not provided. In addition, a dotted line illustrated in FIG. 6 represents the average value of the magnetic field intensity in the slot hole 12s in a case where the width RAW is the same as the width GW of the waveguide 12.

As illustrated in FIG. 6, it is confirmed that the magnetic field intensity in the slot hole 12s in a case where the width RAW of the first ridge portion 40 is larger than 18 mm and smaller than 52 mm, is greater than the magnetic field intensity in the slot hole 12s in a case where the width RAW is the same as the width GW of the waveguide 12. That is, it is confirmed that the power density of the microwave in the slot hole 12s becomes high in a case where the width RAW of the first ridge portion 40 is larger than 18 mm and smaller than 52 mm.

Next, a second simulation will be described. In the second simulation, magnetic field intensity in the slot hole 12s was obtained while changing the height RAH of the first ridge portion 40 to various values as a parameter. Conditions for the second simulation are listed as below.

Conditions for the Second Simulation
    Width GW of the waveguide 12: 96 mm
    Height GH of the waveguide 12: 27 mm
    Width RAW of the first ridge portion 40: 32 mm
    Length RAL of the first ridge portion 40: 400 mm
    Position where the slot hole 12s is formed (distance SP): 8 mm
    Length SL of the slot hole 12s: 300 mm
    Width SW of the slot hole 12s: 0.1 mm
    Frequency of the microwave: 2.45 GHz
    Power of the microwave: 2.5 kW
    Mode of the microwave: continuous wave.

Figure 7:
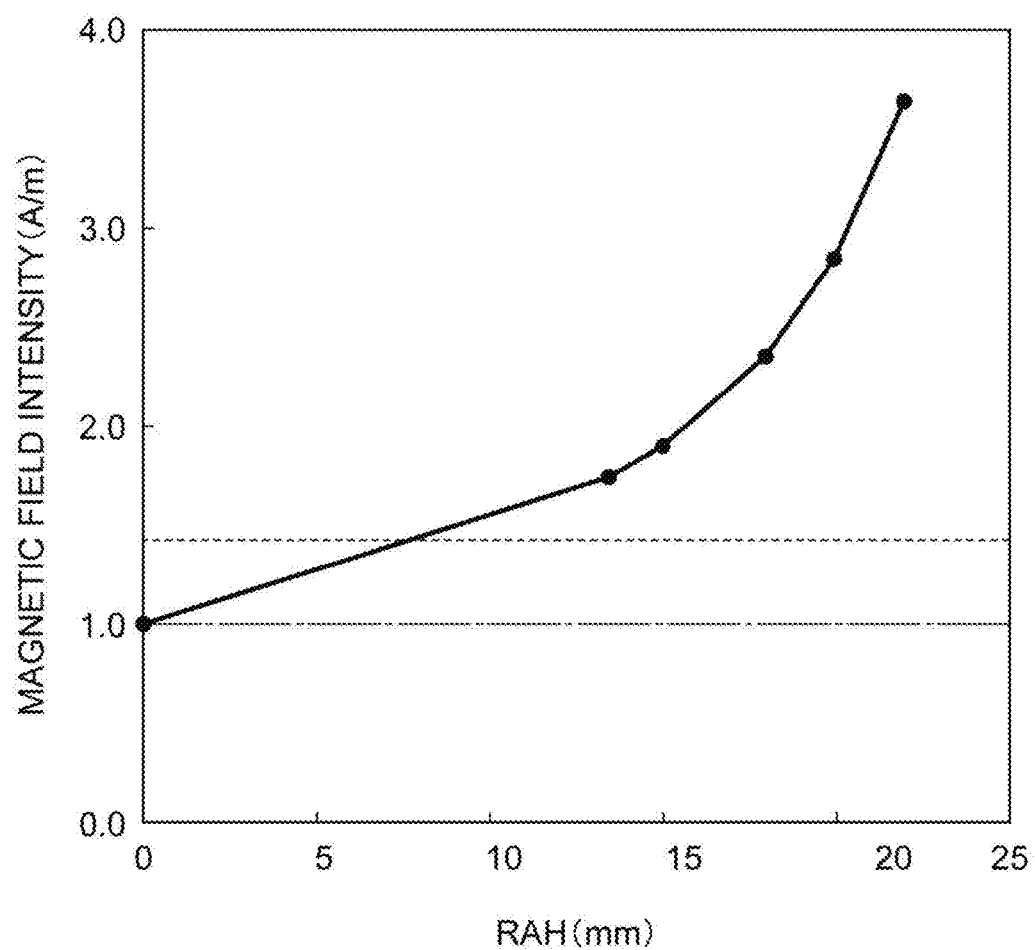
FIG. 7 is a graph illustrating a result of a second simulation.

FIG. 7 is a graph illustrating a result of the second simulation. The horizontal axis in FIG. 7 represents the height RAH of the first ridge portion 40 and the vertical axis represents an average value of the magnetic field intensity in the slot hole 12s. In addition, a dash-dotted line illustrated in FIG. 7 represents the average value of the magnetic field intensity in the slot hole 12s in a case where the first ridge portion 40 and second ridge portions 42 are not provided. In addition, a dotted line illustrated in FIG. 7 represents the average value of the magnetic field intensity in the slot hole 12s in a case where the width RAW is the same as the width GW of the waveguide 12 and the height RAH is 13.5 mm.

As illustrated in FIG. 7, it is confirmed that in a case where the height RAH of the first ridge portion 40 is larger than 7.5 mm, it is possible to obtain the magnetic field intensity in the slot hole 12s, which is greater than that in a case where the width RAW is the same as the width GW of the waveguide 12 and the height RAH is 13.5 mm. That is, it is confirmed that the power density of the microwave in the slot hole 12s becomes high in a case where the height RAH of the first ridge portion 40 is larger than 7.5 mm.

Next, a third simulation will be described. In the third simulation, an $S_{11}$ parameter was obtained while changing the height RBH of the second ridge portions 42 to various values as a parameter. Conditions for the third simulation are listed as below.

Conditions for the Third Simulation
    Width GW of the waveguide 12: 96 mm
    Height GH of the waveguide 12: 27 mm
    Width RAW of the first ridge portion 40: 32 mm
    height RAH of the first ridge portion 40: 13.5 mm
    Length RAL of the first ridge portion 40: 400 mm Position where the slot hole 12*s* is formed (distance SP): 8 mm
  Length SL of the slot hole 12*s*: 300 mm
  Width SW of the slot hole 12*s*: 0.1 mm
  Length RBL of the second ridge portions 42: 39.5 mm
  Frequency of the microwave: 2.45 GHz
  Power of the microwave: 2.5 kW
  Mode of the microwave: continuous wave.

Figure 8:
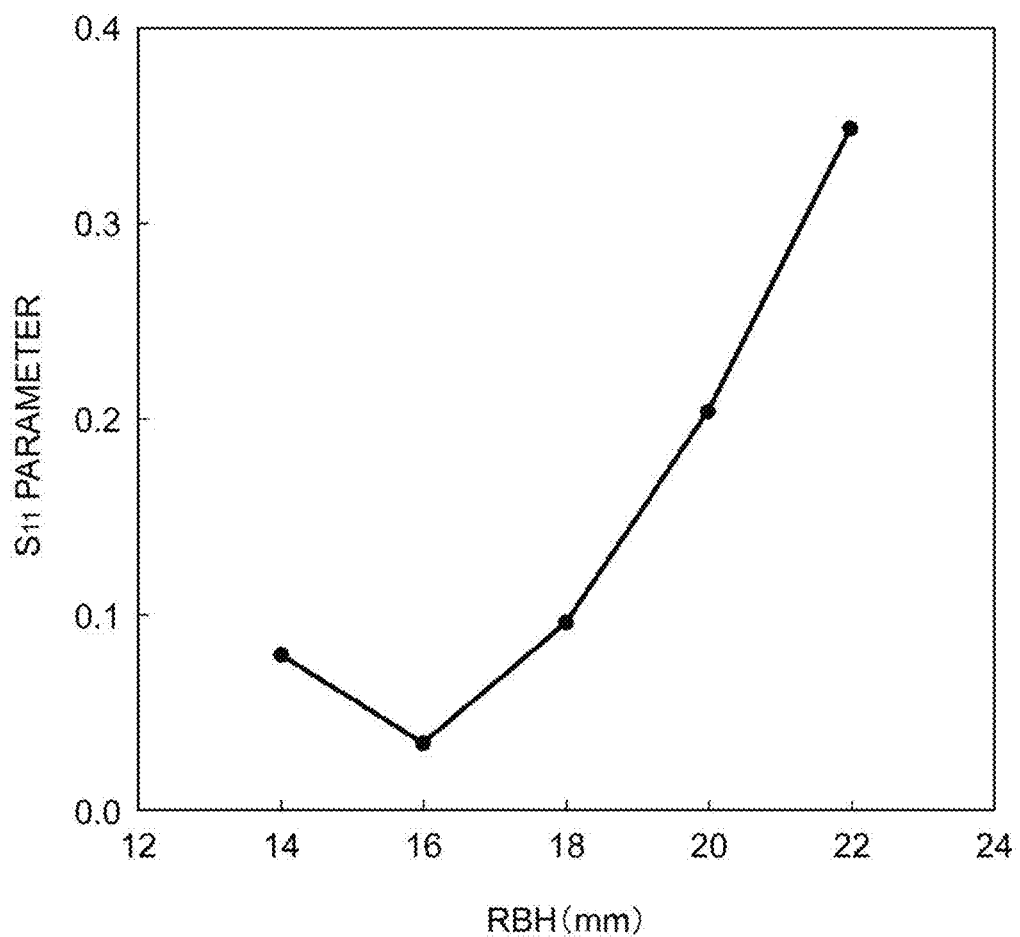
FIG. 8 is a graph illustrating a result of a third simulation.

FIG. 8 is a graph illustrating a result of the third simulation. The horizontal axis in FIG. 8 represents the height RBH of the second ridge portion 42 and the vertical axis represents the $S_{11}$ parameter. As illustrated in FIG. 8, in a case where the height RBH of the second ridge portion 42 is not less than 14 mm and not more than 18, the $S_{11}$ parameter becomes equal to or smaller 0.1. That is, it is confirmed that the reflection of the microwave at both ends of the first ridge portion 40 is significantly suppressed in a case where the height RBH of the second ridge portions 42 is not less than 14 mm and not more than 18 mm.

Hereinafter, an experiment performed for the evaluation of the microwave supply apparatus 10 will be described. In this experiment, 2 slm of the nitrogen gas was supplied into the waveguide 12 of the microwave supply apparatus 10, and plasma emission in the slot hole 12*s* was imaged. In imaging the plasma emission, the exposure time was set to 20 ms. Conditions for the experiment are listed as below.

Conditions for Experiment
  Width GW of the waveguide 12: 96 mm
  Height GH of the waveguide 12: 27 mm
  Width RAW of the first ridge portion 40: 32 mm
  Height RAH of the first ridge portion 40: 13.5 mm
  Length RAL of the first ridge portion 40: 400 mm
  Position where the slot hole 12*s* is formed (distance SP): 8 mm
  Length SL of the slot hole 12*s*: 300 mm
  Width SW of the slot hole 12*s*: 0.1 mm
  Length RBL of the second ridge portion 42: 40 mm
  Height RBH of the second ridge portion 42: 22 mm
  Frequency of the microwave: 2.45 GHz
  Power of the microwave: 2.0 kW and 2.5 kW
  Mode of the microwave: continuous wave.

Figure 9A:
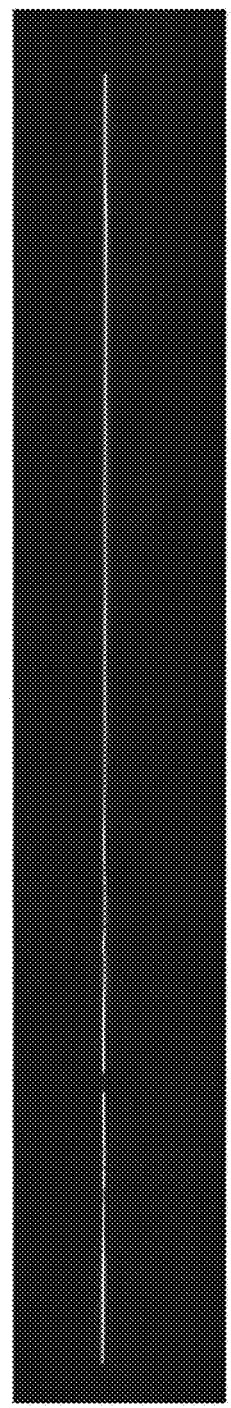
FIG. 9A is an image illustrating a plasma emission when the power of the microwave is set to 2.0 kW.
Figure 9B:
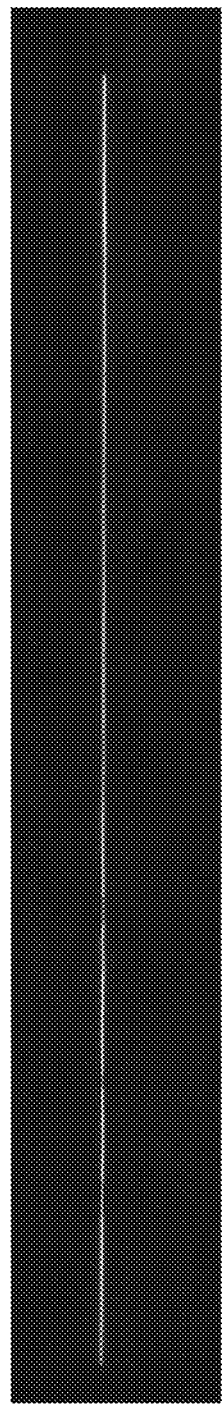
FIG. 9B is an image illustrating a plasma emission when the power of the microwave is set to 2.5 kW.

In FIG. 9A, an image of the plasma emission when the power of the microwave is set to 2.0 kW is illustrated, and in FIG. 9B, an image of the plasma emission when the power of the microwave is set to 2.5 kW is illustrated. As illustrated in FIG. 9A and FIG. 9B, according to the microwave supply apparatus 10, it is confirmed that the plasma can be stably generated across the slot hole 12*s* without depending on the power of the microwave even if the nitrogen gas which is the molecular gas is used.

Hereinbefore, various embodiments are described. However, various modifications may be made without being limited to the above-described embodiments. For example, a dielectric may be provided in the waveguide 12. The dielectric extends between the first ridge portion 40 of the waveguide 12 and the fourth wall 124 in Y direction and between the first wall 121 and the second wall 122 in Z direction. According to the dielectric, it is possible to further increase the power density of the microwave in the slot hole 12*s*.

From the foregoing description, it will be appreciated that various embodiments of the present disclosure have been described herein for purposes of illustration, and that various modifications may be made without departing from the scope and spirit of the present disclosure. Accordingly, the various embodiments disclosed herein are not intended to be limiting, with the true scope and spirit being indicated by the following claims.

What is claimed is:

1. A microwave supply apparatus for supplying a microwave for generation of plasma, the apparatus comprising:
  a waveguide including a first end and a second end, and extending between the first end and the second end;
  a circulator including a first port, a second port coupled to the first end, and a third port coupled to the second end, the circulator being configured to propagate the microwave coming from an input end of the microwave supply apparatus, from the first port to the second port, and return the microwave received at the third port, from the first port to a side of the input end; and
  a matcher provided between the input end and the first port of the circulator, the matcher being configured to reflect a part of the microwave returned from the first port to the side of the input end, to the first port of the circulator,
  wherein the waveguide includes a rectangular waveguide, the rectangular waveguide including a first wall and a second wall that face each other, and a third wall and a fourth wall that intersect with the first wall and the second wall and face each other,
  wherein a slot hole extending along a propagation direction of the microwave in the waveguide is formed in the first wall, and the slot hole is provided in a region deviated to a side of the third wall,
  wherein the waveguide includes a first ridge portion provided in the waveguide, and
  wherein the first ridge portion has a rectangular parallelepiped shape, is separated from the first wall, faces the slot hole, is in contact with the second wall and the third wall, and is separated from the fourth wall.

2. The microwave supply apparatus according to claim 1, wherein a width of the first ridge portion in a first direction in which the third wall and the fourth wall are facing each other is larger than 18 mm and smaller than 52 mm.

3. The microwave supply apparatus according to claim 1, wherein a height of the first ridge portion in a second direction in which the first wall and the second wall are facing each other is larger than 7.5 mm and smaller than a height of the waveguide in the second direction.

4. The microwave supply apparatus according to claim 1, further comprising:
  second ridge portions provided continuously to both ends of the first ridge portion in the propagation direction,
  wherein each of the second ridge portions has a rectangular parallelepiped shape, is separated from the first wall, and is in contact with the second wall and the third wall, and to be separated from the fourth wall, and
  wherein a length of a gap between the first wall and each of the second ridge portions is larger than a gap between the first wall and the first ridge portion.

5. The microwave supply apparatus according to claim 4, a height of each of the second ridge portions in a direction in which the first wall and the second wall are facing each other is not less than 14 mm and not more than 18 mm.

6. The microwave supply apparatus according to claim 1, further comprising:
  a gas supply hole to introduce a processing gas for generation of plasma into the waveguide.

7. The microwave supply apparatus according to claim 1, further comprising:

a microwave generator configured to generate a microwave and to supply the microwave to the input end.

8. A plasma processing apparatus comprising:
the microwave supply apparatus according to claim 7;
a gas supply unit configured to supply a processing gas to the slot hole; and
a chamber body providing a chamber for processing a workpiece therein by plasma of the processing gas.

9. A plasma processing method in which the plasma processing apparatus according to claim 8 is used, the method comprising:
accommodating a workpiece in the chamber; and
processing the workpiece by plasma of the processing gas supplied from the gas supply unit.

10. The plasma processing method according to claim 9, wherein the processing gas contains a molecular gas, and a ratio of a flow rate of the molecular gas to a total flow rate of the processing gas is not less than 0.2 and not more than 1.

11. The plasma processing method according to claim 10, wherein the molecular gas is nitrogen gas.

* * * * *